United States Patent [19]
Swanke

[11] Patent Number: 5,521,533
[45] Date of Patent: May 28, 1996

[54] APPARATUS AND METHOD FOR SPURIOUS SIGNAL REDUCTION IN DIRECT-DIGITAL SYNTHESIZERS

[75] Inventor: Christopher J. Swanke, Cedar Rapids, Iowa

[73] Assignee: Rockwell International, Seal Beach, Calif.

[21] Appl. No.: 308,033

[22] Filed: Sep. 16, 1994

[51] Int. Cl.[6] ................................................. H03B 21/00
[52] U.S. Cl. ........................... 327/107; 327/551; 327/105; 327/113; 327/106; 364/721; 331/16
[58] Field of Search ................................ 327/105, 106, 327/107, 551, 552, 113, 116, 119, 121, 291, 310, 311; 364/572, 574, 721; 331/16, 18

[56] References Cited

U.S. PATENT DOCUMENTS

| | | | |
|---|---|---|---|
| 3,772,584 | 11/1973 | Barley et al. | 327/115 |
| 4,951,237 | 8/1990 | Essenwanger | 364/721 |
| 4,975,699 | 12/1990 | Frey | 341/118 |
| 4,992,743 | 2/1991 | Sheffer | 327/106 |
| 5,014,231 | 5/1991 | Reinhardt et al. | 364/718 |
| 5,093,636 | 3/1992 | Higgins et al. | 332/100 |
| 5,122,763 | 6/1992 | Saeki et al. | 331/2 |

*Primary Examiner*—Timothy P. Callahan
*Assistant Examiner*—Dinh T. Le
*Attorney, Agent, or Firm*—Kyle Eppele; M. Lee Murrah; George A. Montanye

[57] ABSTRACT

A synthesizer based upon direct-digital frequency synthesizer techniques of simplistic design and minimized spurious signal levels. The output signals of two frequency hopped direct-digital frequency synthesizers are combined with the resultant signal having a greatly suppressed spurious signal level due to the channel spacing variation of the spur. Alternate embodiments concern the number and functional location of digital-to-analog converters, varying the clock signal and the use of high-pass filters.

6 Claims, 1 Drawing Sheet

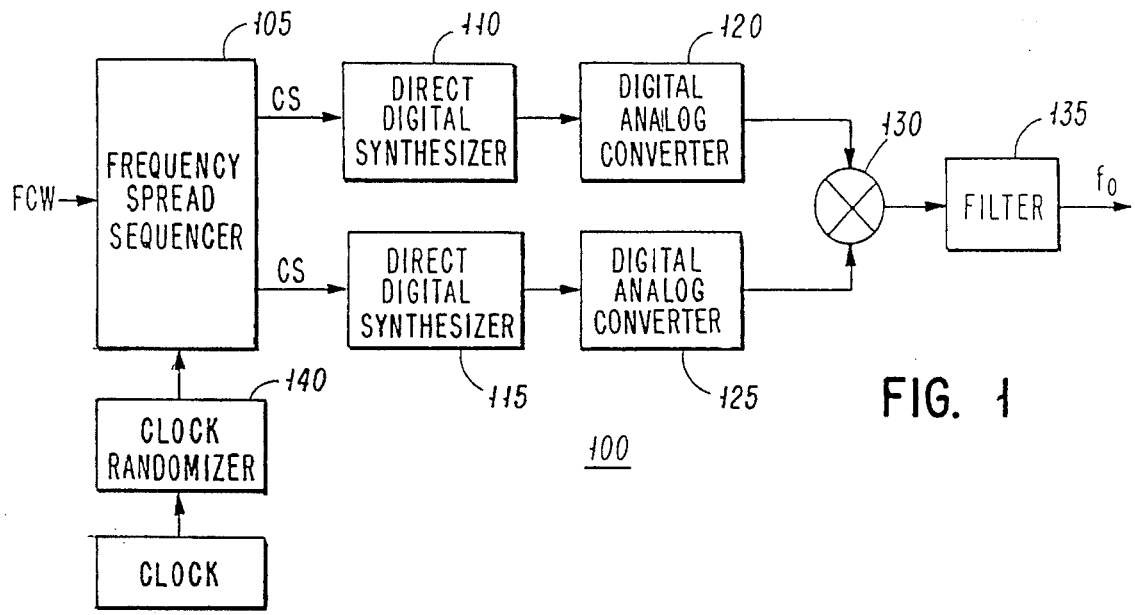
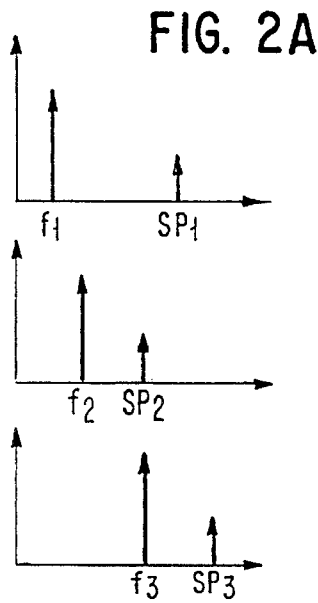 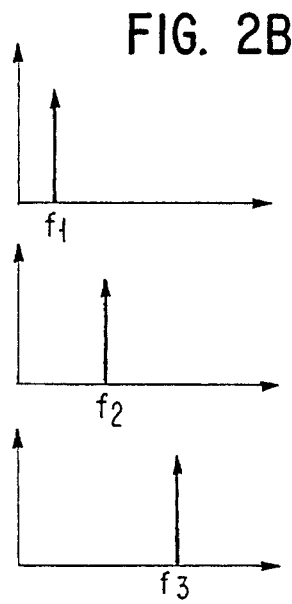 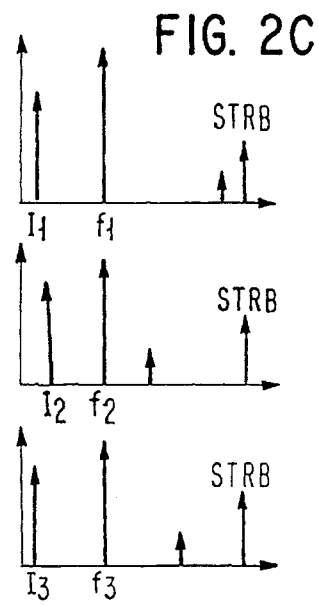
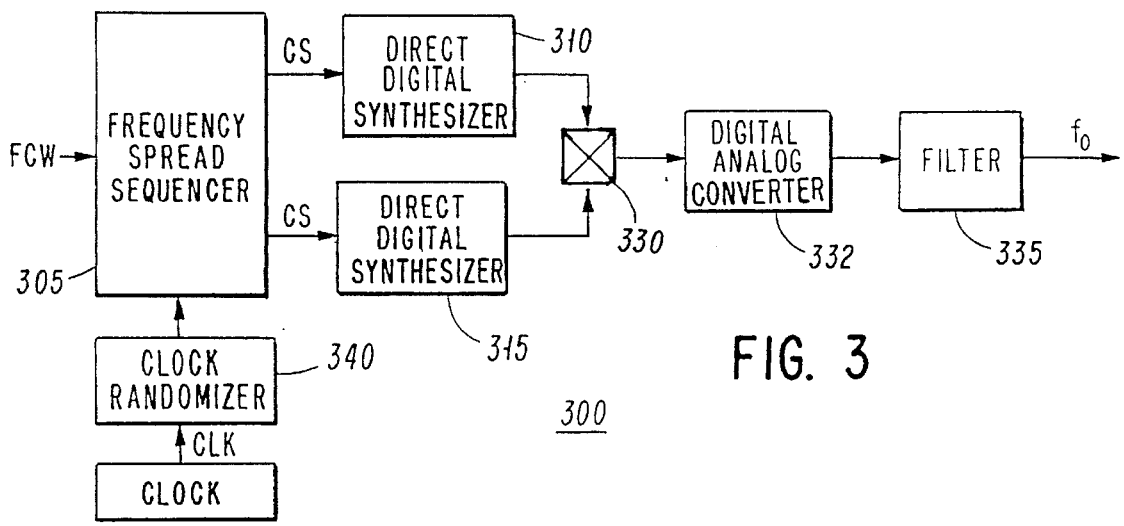

APPARATUS AND METHOD FOR SPURIOUS SIGNAL REDUCTION IN DIRECT-DIGITAL SYNTHESIZERS

BACKGROUND OF THE INVENTION

The present invention relates to direct-digital frequency synthesizers and in particular to an apparatus and method for reducing the spurious signal components of the output signals of such direct-digital frequency synthesizers. A continued goal in the design of radio communications systems has been implementation of a simple, low cost frequency synthesizer that can provide large range discrete frequencies over a wide frequency spectrum. The direct-digital frequency synthesizer (DDS) is one such apparatus known in the prior art. The DDS can provide by external command any discrete and precise frequency within its range and resolution. Additionally, use of a DDS generally provides fast switching speeds, excellent: temperature and aging stability, and allows for continuous switching of the carrier signal. In light of such attributes a direct-digital frequency synthesizer is commonly used in phase and frequency modulation and frequency-hopping schemes, as well as spread-spectrum communications.

The output frequency of a DDS is determined by an input digital frequency control word. This frequency control word can be generated by a digital processor. Many modulation schemes can be implemented such as FSK, FM, PM or DPSK. Thus, for example, the output frequency can be frequency modulated according to the digitized information (FSK modulation). In addition to the FSK modulation, the window of modulation frequencies can "hop", thereby moving the window of modulated frequencies in the coded scheme to avoid jamming or decoding by unauthorized transceivers. It is the agility and the frequency resolution of the DDS that makes it superior to other synthesizers in such an application, and gives an unauthorized transceiver less time to lock on the correct code and them jam or decode it. Naturally, the authorized receiver must hop to the correct frequency to receive the modulated information. Typically, the receivers digital processor generates the correct digital control word for the receivers DDS and subsequent down conversion, demodulation and decoding.

The heart of the DDS is an accumulator. The accumulator is a digital integrator consisting of a latch and full adder with the output sum and the input digital control word as input signals to the adder. The frequency word determines the step size by which the accumulated sum is incremented. Each step represents a step or increment in phase. Thus, larger frequency words result in larger steps and phase. In addition, the rate of over-flow of the accumulator determines the output frequency. The output frequency is a fraction of the clock frequency; thus, its spurious performance has similarities to a fractional divider. However, some frequencies are not submultiples of the clock frequency, and accumulator over flow occurs with varying remainders left in the accumulator. The residue left in the accumulator varies the output periods such that a sequence of different output periods result. The average of this sequence of periods is the desired period and thus, determines the output frequency. However, since this sequence of periods is also different from an ideal repetition of the exact period, spurious line frequencies or "spurs" unique to each output frequency are created. Such spurs represent departure of the output waveform from a precisely periodic signal.

Prior art techniques of suppressing such spurs have typically involved use of a sine approximation technique. Such a sine approximation technique is typically based on the premise that the instantaneous error from an ideal sinusoidal frequency of constant period is reduced, thereby suppressing the spurious signal level. Alternate solutions are typically based upon feeding a value corresponding to a random sequence of values thereby randomly varying the spurs, thereby reducing such signals.

Unfortunately, the use of such prior art solutions has numerous limitations. Often close-in spurs, those near the desired frequency, are inadequately handled. Additional limitations exist due to the predetermined nature of the counter effect to the unwanted spur signal.

Accordingly, a need exists for an apparatus that is based upon DDS theory that yields a desired output signal of minimum distortion.

SUMMARY OF THE INVENTION

The present invention provides an apparatus and method for generating a signal based upon direct-digital synthesizer technology having reduced spurious signal distortion over prior art direct-digital synthesizers.

One implementation of the present invention is comprised of a pair of direct-digital synthesizers each coupled to a digital-to-analog converter and in turn to a mixer. The synthesizers receive synchronized frequency hopping control signals from a frequency-spread sequencer. The mixer yields a constant resultant frequency output signal of greatly suppressed spurious signal distortion based upon the fall-out of the distortion component at the mixer due to its varying channel spacing during the hopping sequence.

Alternate embodiments of the above described apparatus retain the advantage of the spurious signal suppression achieved at the mixer, but vary the configuration of the apparatus dependent upon desired design goals. One such embodiment is described as having a single digital-to-analog converter located after a digital multiplier. Another embodiment is described as altering the clock signal so as to suppress any spurious signal associated with such an input. Yet another embodiment includes the use of a filter located after the mixer to reject the undesired signals created in the mixing process.

It is an object of the present invention to provide an apparatus for generating a modulated signal of minimal distortion.

It is a feature of the present invention to utilize a pair of direct-digital synthesizers coupled to a mixer to provide an output signal.

It is an advantage of the present invention that the spurious signal component of each direct-digital synthesizer is suppressed at the mixer, due to the varying channel spacing during the hopping sequence.

These and other objects, features and advantages are disclosed and claimed in the specification, figures and claims of the present application.

BRIEF DESCRIPTION OF THE DRAWINGS

FIG. 1 is a block diagram of one embodiment of an apparatus incorporating the teachings of the present invention;

FIG. 2A is a graphical depiction of the output signal of one of the direct-digital synthesizers of FIG. 1;

FIG. 2B is a graphical depiction of the output signal of the second direct-digital synthesizers of FIG. 1 synchronized in time with the DDS of FIG. 2A;

FIG. 2C is a graphical depiction of the output signal of the mixer of FIG. 1 with respect to the output signals of FIGS. 2A and 2B; and FIG. 3 is a block diagram of an alternate embodiment of the apparatus of FIG. 1.

DETAILED DESCRIPTION

Turning now to the drawings where like items are referenced as such throughout, FIG. 1 illustrates a block diagram of a first embodiment of a device 100 that illustrates the teachings of the present invention. A frequency-spread sequencer 105 is coupled to two direct-digital frequency synthesizers (DDS) 110, 115 which in turn are coupled to two DACs 120, 125 as shown. Each DAC 120, 125 has its output signal coupled to a mixer 130. The mixer 130 couples its output signal through a filter 135. The frequency-spread sequencer 105 is also coupled to a clock signal (CLK), which is shown coupled via a clock randomizer 140.

In operation the device 100, of FIG. 1 receives an input signal FCW that is a frequency controlled word signal reflecting a desired output signal $F_0$. The frequency-spread sequencer 105 is responsive to signal FCW and clock signal CLK thereby providing control signal CS to the DDSs 110, 115. The digital output signal of each DDS is converted to a analog equivalent via DACs 120, 125. The output signals of DACs 120, 125 contain the desired signal component, that in this instance has been frequency-hopped by means of the frequency-spread sequencer 105, along with undesired signal components attributable to the DACs 120, 125 and the generation of spurs by the DDSs 110, 115. The mixer 130 combines the two frequency hopped DDS signals to produce a constant output frequency, while simultaneously diminishing the value of the undesired signal component due to the varying channel spacing during the hopping sequence. The filter 135 is coupled to the output signal of the mixer 130, thereby removing undesired image frequency signal components that are resultant from the mixer 130.

The above described operation may perhaps be better understood by examining FIGS. 2A through 2C. For purposes of this illustration a three-hop spreading sequence is assumed, although it is understood that the concept of this invention is not so limited to only a three-hop spreading application. FIG. 2A illustrates the graphical depiction of the output of one of the DDSs such as 110, that depicts the desired component ($f_1$, $f_2$, $f_3$) and the spurious unwanted signal ($SP_1$, $SP_2$, $SP_3$). For simplicity only, one spurious signal component is shown for one DDS output, although in actuality additional unwanted signal components due to each DDS and DAC may also may be present in each input signal to the mixer 130 (see FIG. 1).

FIG. 2B illustrates the plotted input signal of the second DDS 115 after analog conversion by the DAC 125. In this instance a "pure," desired signal is shown for purposes of this illustration. The signals ($f_1$, $f_2$, $f_3$) correspond to the counterpart signals of FIG. 2A.

FIG. 2C illustrates the plotted output signal components of the combined input signals of FIGS. 2A and 2B. The mixed desired signal components of each hop combined at a fixed sum or difference frequency ($f_1$, $f_2$, $f_3$). Also shown is the image signal component ($I_1$, $I_2$, $I_3$) representative of the difference between the desired signal components. The undesired image frequency signal can be effectively filtered by the filter 135. The undesired spurious signals ($SP_1$, $SP_2$, $SP_3$) were diminished in magnitude and affect, due to their varying channel spacing on each hop and no associated counterpart exists in the combined signal. Also shown in FIG. 2C is an undesired component STRB that is attributable to the clock signal of the frequency spreader (see FIG. 1). The magnitude of the STRB signal can be dramatically decreased by use of the clock randomizer 140 (FIG. 1) that effectively dissipates the undesired STRB signal over each hopping state. Thus, by varying the output signal of the DDSs 110, 115 within a predetermined bandwidth, in a random frequency output pattern that always produces the same mixed frequency, the spurious signal components from each DDS will be suppressed based upon the non-linear relationship of the channel spacing between the desired output frequency and the spurious signal components.

FIG. 3 illustrates an alternate embodiment of the present invention. As opposed to the device of FIG. 1, device 300 provides for digital-to-analog conversion after the digital multiplication of the output signals of the two DDSs 310, 315. As in the previous embodiment, a frequency-spread sequencer 305 receives a control signal FCW along with a randomized clock signal CLK. The digital multiplier 330 performs the same function as the mixer with the same advantageous results as before with respect to undesired signal components generated by the DDSs 310, 315. Since the analog conversion occurs after spreading and despreading, the digital multiplier 330 provides no improvement in spurious generated by the DAC 332. The device 300 maybe a preferred approach dependent upon design criteria. It is understood that the devices 100, 300 of FIGS. 1 and 3 maybe implemented in a variety of commercially available components.

Those skilled in the art will readily recognize that various modifications and changes may be made to the present invention without from departing from the true spirit and scope thereof which is set forth in the following claims.

I claim:

1. An apparatus for generating an output signal comprising:

a frequency spread sequencer that receives an input signal and provides a first and second output signal, respectively to a first and second output port;

a clock device coupled to the frequency spread sequencer;

a first direct-digital synthesizer coupled to said first output port of the frequency spread sequencer;

a second direct-digital synthesizer coupled to said second output port of the frequency spread sequencer;

a first digital-to-analog converter coupled to an output port of the first direct-digital synthesizer and having a first output port;

a second digital-to-analog converter coupled to an output port of the second direct-digital synthesizer and having a second output port; and a mixer coupled to the first and second output ports of the first and second digital-to-analog converter and provides said output signal;

wherein the mixer mixes two frequency hopped signals generated by the frequency spread sequencer and said first and second direct-digital synthesizers and provides suppression of spurious components due to the channel space variation of the spurious component during each hop.

2. The apparatus of claim 1, further comprising a clock randomizer coupled between the clock and the frequency spread sequencer for varying the occurrence of the clock signal to the frequency spread sequencer.

3. An apparatus for generating an output signal comprising:

a frequency spread sequencer having a first input port for inputting a control signal;

a second input port for inputting a clock signal;

a clock device coupled to a second input port of the frequency spread sequencer;

a first direct-digital synthesizer coupled to a first output port of the frequency spread sequencer;

a second direct-digital synthesizer coupled to a second output port of the frequency spread synthesizer;

a mixer coupled to the output ports of said first and second direct-digital synthesizers;

a digital-to-analog converter coupled to an output port of the mixer; and wherein the mixer, mixes the two frequency hopped signals generated by the frequency spread sequencer and said first and second direct-digital synthesizers and provides suppression of spurious components due to the channel space variation of the spurious components during each hop.

4. The apparatus of claim 3, further comprising a clock randomizer coupled between the clock and the frequency spread sequencer for varying the occurrence of the clock signal to the frequency spread sequencer.

5. An apparatus for generating a modulated output signal having an input port for receiving a control signal, comprising:

a frequency spread sequencer that receives said control signal and provides a first and second frequency hopped control signal respectively to first and second output port;

a clock device coupled to the frequency spread sequencer;

a first direct-digital synthesizer coupled to said first output port of the frequency spread sequencer;

a second direct-digital synthesizer coupled to said second output port of the frequency spread sequencer;

a digital multiplier coupled to the first and second direct-digital synthesizer;

a digital-to-analog converter coupled to an output port of the digital multiplier; and wherein the digital multiplier mixes the two frequency hopped signals generated by the frequency spread sequencer and said first and second direct-digital synthesizers and provides suppression of spurious components due to the channel space variation of the spurious components during each hop.

6. The apparatus of claim 5, further comprising a clock randomizer coupled between the clock and the frequency spread sequencer for varying the occurrence of the clock signal to the frequency spread sequencer.

* * * * *